US006621844B1

(12) United States Patent
Chua et al.

(10) Patent No.: US 6,621,844 B1
(45) Date of Patent: Sep. 16, 2003

(54) BURIED OXIDE PHOTONIC DEVICE WITH LARGE CONTACT AND PRECISE APERTURE

(75) Inventors: Christopher L. Chua, San Jose, CA (US); David W. Treat, San Jose, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/484,508

(22) Filed: Jan. 18, 2000

(51) Int. Cl.[7] ................................................ H01S 5/00
(52) U.S. Cl. ............................................ 372/46; 372/45
(58) Field of Search ................................ 372/46, 96, 50, 372/92, 99, 45

(56) References Cited

U.S. PATENT DOCUMENTS 5,896,408 A    4/1999    Corzine et al. ............... 372/46
6,075,804 A  * 6/2000    Deppe et al. .................. 372/96

* cited by examiner

*Primary Examiner*—Quyen Leung
(74) *Attorney, Agent, or Firm*—Fay, Sharpe, Fagan, Minnich & McKee, LLP (57) ABSTRACT

A photonic device includes a plurality of semi-conductor layers formed on a substrate. The semi-conductor layers include an active layer and a current controlling region in close proximity to the active layer. The current controlling region includes a relatively small electrically conductive section or aperture, and a relatively large non-conductive section. A plurality of channels in the device are arranged to bound the electrically conductive section within their perimeter. The channels are spaced close enough together, and close enough to the desired aperture region to permit a relatively brief oxidation process to precisely isolate the aperture. The remainder of the current controlling region, i.e. beyond the aperture is also altered to present a high resistance. The photonic device also includes a relatively large surface area electrical contact used to drive the device. The large size desirably lowers overall resistance.

15 Claims, 9 Drawing Sheets

BURIED OXIDE PHOTONIC DEVICE WITH LARGE CONTACT AND PRECISE APERTURE

FIELD OF INVENTION

The present invention relates generally to photonic devices. more specifically, the invention de-couples the traditional trade off between device resistance as a function of contact size and precision of the aperture. It is to be appreciated that the present invention is amenable to many applications such as, Vertical Cavity Surface Emitting Lasers (VCSEL's), resonant cavity LED's, photodetectors, edge emitting lasers, and LED's.

BACKGROUND OF THE INVENTION

There are many semiconductor devices that require within their structure an electrically conductive region bounded by an electrically insulating region. Examples of such devices include vertical cavity surface-emitting lasers (VCSELs), edge-emitting lasers, light-emitting diodes (LEDs) and photodetectors. In many of these devices, the electrically insulating region should preferably have a lower refractive index than the conductive region. Recently, there has been an increased interest in forming the electrically insulating region by laterally oxidizing at least one semiconductor layer. The oxidation process selectively converts the conducting semiconductor layer into a lower refractive index insulator.

Figure 1:
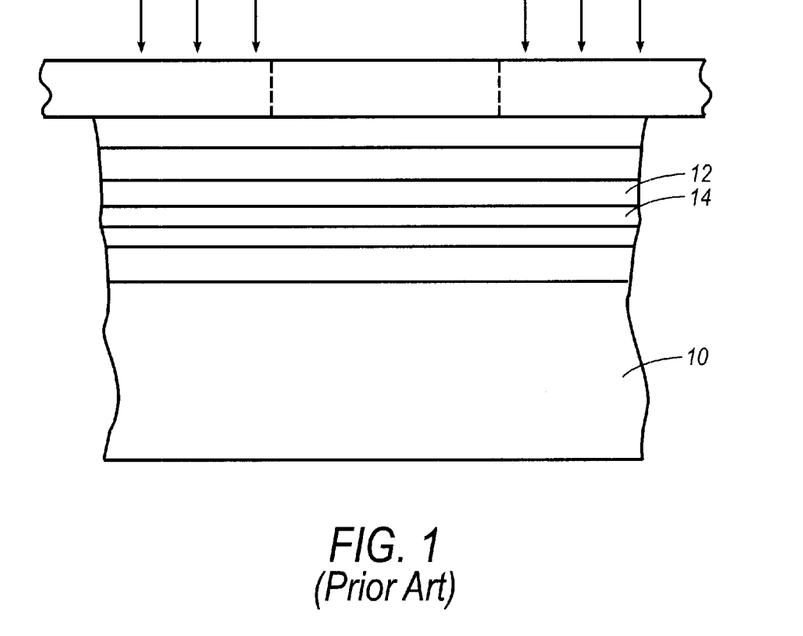
FIGS. 1 and 2 illustrate a prior art approach to the formation of a laser aperture in a VCSEL structure.
Figure 2:
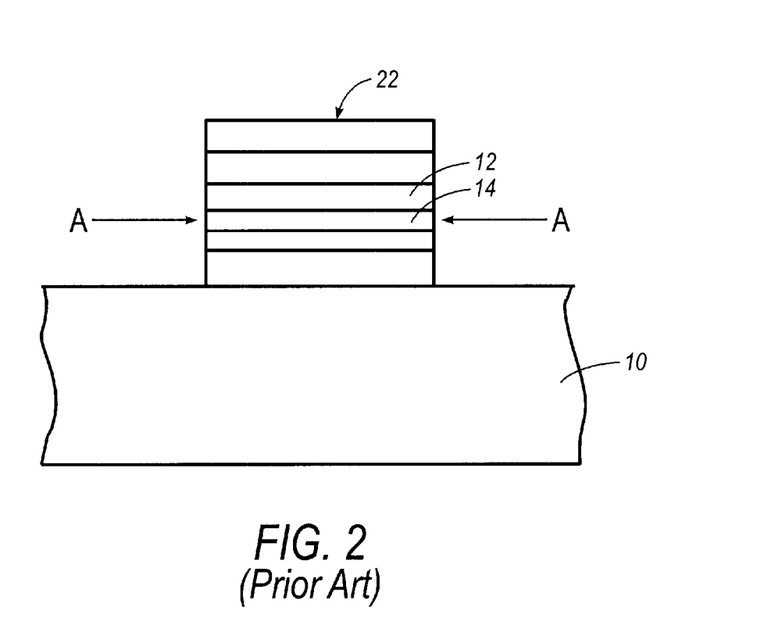

A known technique to fabricate many photonic devices can be illustrated by a VCSEL formed by a lateral oxidation process, schematically illustrated in FIGS. 1 and 2. Under this approach, a laser structure comprising a plurality of layers is formed upon substrate 10. These layers include an active layer 12 and an AlGaAs layer 14 with a high aluminum content. The AlGaAs layer 14 is placed either above or below the active layer of a laser structure. Then, the layered structure is masked and selectively etched to form a mesa structure 22 as illustrated in FIG. 2. As a result of the etching, the AlGaAs layer 14 with a high aluminum content adjacent to the active layer 12 is exposed at the edges of the mesa structure 22. To form the lasing emissive region or "aperture", this AlGaAs layer is oxidized laterally from the edges towards the center of the mesa structure as represented by arrows A. Other layers in the structure remain essentially unoxidized since their aluminum content is lower. Consequently, their oxidation rates are also substantially lower. Therefore, only the AlGaAs layer with high aluminum content is being oxidized. The oxidized portions of the high aluminum content layer become electrically non-conductive as a result of the oxidation process. The remaining unoxidized region, which is conductive, in the AlGaAs layer forms the so-called "aperture", a region which determines the current path in the laser structure, and thereby determines the region of laser emission. A VCSEL formed by such a technique is discussed in "Selectively Oxidized Vertical Cavity Surface Emitting Lasers With 50% Power Conversion Efficiency," Electronics Letters, vol. 31, pp.208–209 (1995).

The most common lateral oxidation approach has several disadvantages, such as large mesa, large oxidation region, and poor control of the aperture size. A key disadvantage of this approach is the difficulty in controlling the amount of oxidation. Generally, the desired device aperture is on the order of one to ten microns ($\mu$m), which means that several tens of microns of lateral oxidation will typically be required in order to fabricate the device when oxidizing in from the sides of the much larger mesa, which must typically be 50 to 100 microns in diameter. Since the size of the resulting aperture is small relative to the extent of the lateral oxidation regions, the devices formed generally have severe variations in aperture size as a result of non-uniform oxidation rates from wafer to wafer and across a particular wafer. The oxidation rate of AlGaAs depends strongly on its aluminum composition. Any composition non-uniformity will be reflected by changes in the oxidation rate, which in turn creates uncertainty in the amount of oxidation. The process is also relatively temperature-sensitive. As the oxidation rate varies, it is difficult to ascertain the extent to which a laser structure will be oxidized, thereby decreasing reproducibility in device performance. In short, such a process often creates various manufacturability and yield problems.

Another disadvantage of a photonic device formed by a traditional lateral oxidation approach is that they often suffer from poor mechanical or structural integrity. It is well-known that the upward pressure applied during a packaging process may cause delamination of the entire mesa since the bonding of the oxide layer to the unoxidized GaAs or AlGaAs is generally weak.

Another known technique to fabricate VCSEL's, especially in highly compact arrays is known, and is described for example in U.S. Pat. No. 5,978,408 issued on Nov. 2, 1999 to Thornton. In such highly compact arrays, a number of laser apertures are packed closely together in various geometric shapes. Due to the closeness of the apertures however, relatively small metal contacts are used to bias the laser. Use of these smaller contacts has undesirably raised the resistance of these semi-conductor lasers, thus increasing the voltages required to drive them.

Accordingly, a need exists to separate the interdependence of the size of the electrical contact area and the accuracy with which a desired aperture size can be obtained.

The present invention contemplates a new and improved method and apparatus for forming photonic devices which overcome the above-referenced problems and others.

BRIEF SUMMARY OF INVENTION

The present invention provides a photonic structure, such as lasers, light emitting diodes or photo-detectors, having well-defined and well-controlled oxidized regions, which can be used to define the aperture of the structure. These oxidized regions are formed by the use of a multiplicity of channels arranged in a pattern in the structure. During the oxidation process, an AlGaAs layer with high aluminum content embedded in the semiconductor structure is oxidized radially outwards from each of these channels until overlap in the oxidized regions defines a central conductive aperture. The device aperture is the unoxidized region bounded by these oxidized regions centered about the channels. The AlGaAs layer with high aluminum content for forming the oxidized regions and the aperture is often referred to as an "oxidation layer."

The present invention further provides a semi-conductor photonic structure having a large electrical contact. Larger contacts desirably tend to reduce the resistance of a device. The combination of the large contact size and the precisely placed and oxidized apertures effectively de-couple the usual tradeoff between device resistance and obtainable aperture precision.

In accordance with one aspect of the present invention, a photonic device includes a substrate, and a plurality of semi-conductor layers formed on the substrate. The semiconductor layers include an active layer and a current controlling region near the active layer. The current controlling region includes an electrically insulating section and an electrically conductive section. The current controlling region is penetrated by a plurality of channels surrounding or bounding the electrically conductive section within their perimeter. An electrical contact is also provided on the laser such that at least part of the electrical contact lies outside the perimeter of the channels.

In accordance with another aspect of the present invention, the electrical contact includes an area greater than an area within the perimeter of the channels.

In accordance with another aspect of the present invention, the electrical contact includes an area at least two times larger than the area of the electrically conductive section.

In accordance with another aspect of the present invention, the current controlling region includes an oxidation layer. The electrically insulating section includes an oxidized portion of the oxidation layer. The electrically conductive section includes an unoxidized portion of the oxidation layer.

In accordance with another aspect of the present invention, the current controlling region further includes an electrically insulating ion implanted layer extending from a perimeter of the device or field implant region to at least an area adjacent to the oxidized portion of the oxidation layer.

In accordance with another embodiment of the present invention, a method of forming a photonic device includes forming a plurality of spaced channels in a surface of a semi-conductor layer bounding a desired aperture. The method further includes affixing an electrical contact to the semi-conductor layer, where the electrical contact has an area at least two times greater than an area of the desired aperture.

In accordance with another aspect of the present invention, the method further includes altering selected portions of at least one layer from a generally conductive state to a generally non-conductive state.

In accordance with another aspect of the present invention, the channels permit communication between a surface of the semi-conductor layer and a buried oxide layer. The altering step includes oxidizing a selected portion of the oxide layer.

In accordance with another aspect of the present invention, the altering step further includes implanting at least one layer adjoining the oxidized portion of the oxide layer with ions at a selected energy level.

In accordance with another aspect of the present invention, the electrical contact includes an interruption substantially corresponding to the desired aperture. When attached, the interruption in the contact aligns with the desired aperture.

An advantage of the present invention is that the dimension of the oxidized regions which define the lasing aperture is comparable to the dimension of the lasing aperture itself. Generally, the oxidation rates of AlGaAs depend upon material composition and process parameters, which exhibit significant non-uniformity. These non-uniformities have decreasing impact as the ratio of the size of the oxidized regions to the size of the final laser aperture is reduced. In other words, since the amount of oxidation required to form the lasing aperture is dramatically reduced, the aperture size is therefore much less sensitive to material or process variations. Hence, well-defined and well-controlled apertures can be achieved.

Another advantage of the present invention is that since the present invention does not need small total device size to improve the precision of the apertures, the size of the electrical contact can be increased to reduce the overall device resistance.

Still further advantages and benefits of the present invention will become apparent to those of ordinary skill in the art upon reading and understanding the following detailed description of the invention, its preferred embodiments, the accompanying drawings, and the appended claims.

BRIEF DESCRIPTION OF THE DRAWINGS

The invention may take form in various components and arrangements of components, and in various steps and arrangements of steps. The drawings are only for purposes of illustrating a preferred embodiment and are not be construed as limiting the invention.

DETAILED DESCRIPTION OF PREFERRED EMBODIMENTS

Figure 3:
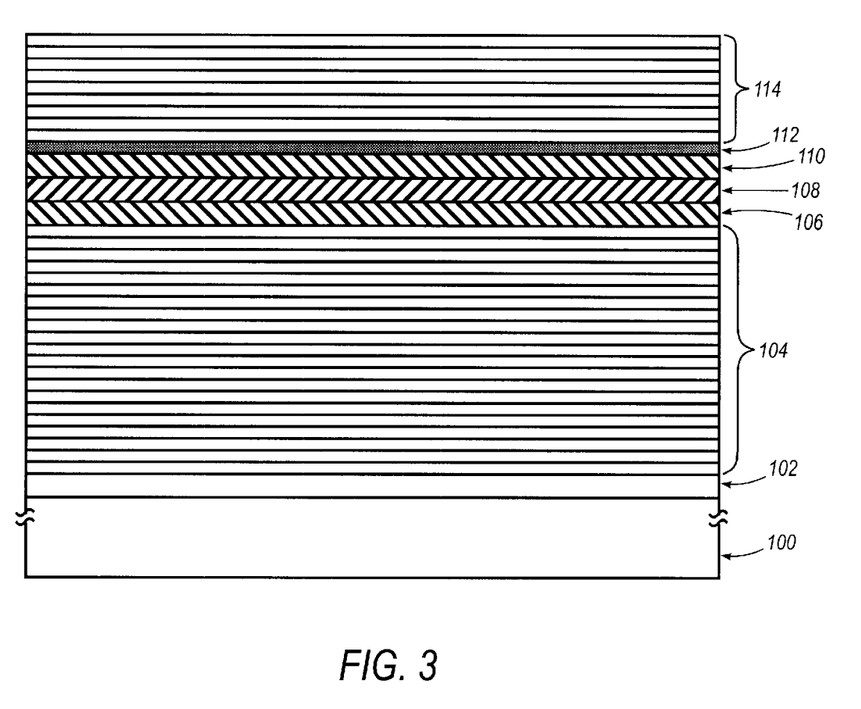
FIG. 3 illustrates a side sectional view of a semiconductor structure which is used in accordance with an embodiment of the present invention.

With reference to FIG. 3, a photonic semiconductor structure which is used to form an embodiment of the present invention includes a number of semiconductor layers, which can be used to form, for example, a vertical cavity surface emitting laser. As will be apparent, the layers are illustrated schematically only and bear no relationship to the relative thicknesses each to the other. As shown in FIG. 3, an n-type GaAs substrate 100 supports an n-type gas buffer layer 102 grown using an epitaxial deposition process, by liquid phase epitaxy ("LPE"), molecular beam epitaxy ("MBE"), or other known crystal growth processes.

Above the GaAs buffer layer 102 is a structure for forming a lower distributed Bragg reflector ("DBR") 104 which provides a portion of the necessary internal reflection in a VCSEL structure. The lower DBR 104 is typically formed by multiple pairs of an AlGaAs layer with a high aluminum content and another AlGaAs layer with a low aluminum content as is conventional in the art. Artisans will appreciate that thickness of the pairs and materials used contribute to the reflectivity of the mirror in known ways.

In the illustrated embodiment of FIG. 3, since light is outcoupled through the top surface of the semiconductor sample, the reflectivity of the lower DBR 104 should be as close to 100% as possible in order to achieve high internal reflection. High internal reflection generally reduces the threshold current of a laser.

After the lower DBR structure 104 has been deposited, an AlGaAs cladding layer 106 is deposited. Above this AlGaAs cladding layer 106 is the active layer 108 of the structure which typically includes quantum wells separated by barriers. Depending upon the desired wavelength of the structure other active layer compositions, such as, pure GaAs or AlGaAs with a low aluminum content may be used to form the quantum well structures as is known. In a reverse biased structure, the active layer 108 can also function as a light collector, enabling the device to be used as a photodector.

Above the active layer 108 is an upper AlGaAs cladding layer 110, which is structurally similar to the lower AlGaAs cladding layer 106 except for the polarity of its dopants. These two AlGaAs cladding layers, 106 and 110, along with the active layer 108 generally form the optical channel in which the desired optical gain can be attained. The total thickness of layers 106, 108, and 110 is adjusted to be equal to an integer multiple of the intended wavelength of laser operation.

Above the upper AlGaAs cladding layer 110 is an oxidation layer 112, which is used to form the laser aperture. As will be further discussed below, the laser aperture controls the current flow and thus the lasing location in the active layer 108. In this embodiment, this oxidation layer 112 is above the upper AlGaAs cladding layer 110. However, those skilled in the art will recognize that placement of this oxidation layer 112 in another location, either further above or below the active layer 108, will not impair functionality. Typically, this oxidation layer 112 constitutes the first layer of an upper DBR mirror and contains a p-type dopant.

After the oxidation layer 112 has been formed, the remainder of an upper DBR mirror 114 which contains p-type doping is deposited. The upper DBR mirror 114 is structurally similar to the lower DBR mirror 104 except for the polarity of its dopants. Additionally, the mirror layer closest to each side of the active region generally has a high aluminum content. As illustrated, this high aluminum content layer doubles as the oxidation layer 112. In this embodiment, the reflectivity of the upper DBR 114 is typically 98% to 99% because light will be outcoupled through the surface of the semiconductor sample.

Figure 4:
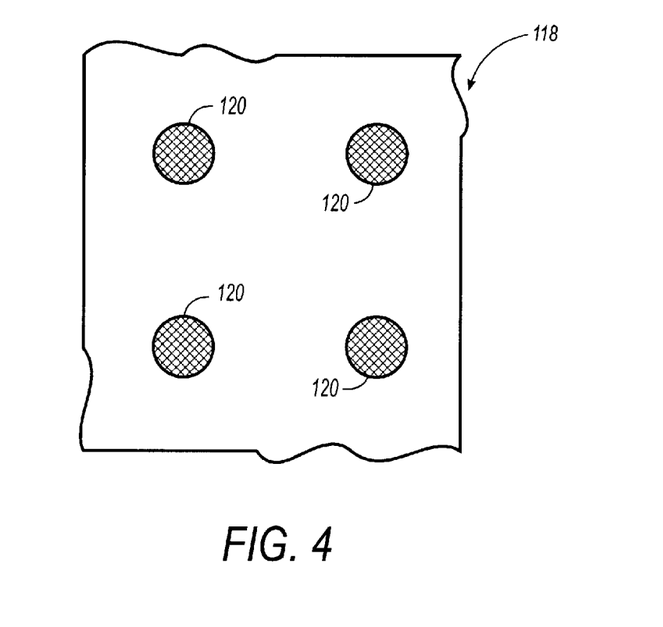
FIG. 4 is a top view of a portion of an exemplary mask applied to the semiconductor structure shown in FIG. 1 under the present invention.

FIG. 4 is a top view of a portion of a mask which may be applied to the semiconductor structure shown in FIG. 3 under the present invention. First, as is conventional, a uniform layer of silicon nitride will be deposited over the entire semiconductor sample. Then, a photoresist layer 118 is deposited over the silicon nitride layer and is formed into the mask shown in FIG. 4 by a photolithographic process which removes photoresist material from four areas 120. The areas 120 form a predetermined bounding pattern which will later be used to define the resulting aperture of a laser structure. It should be appreciated however, that while the areas 120 are illustrated as circular, they could be any shape selected for ease of etching, for example. Moreover, those skilled in the art will appreciate that the number of areas 120 merely affect the shape of the aperture and different numbers can be effectively utilized.

Figure 5:
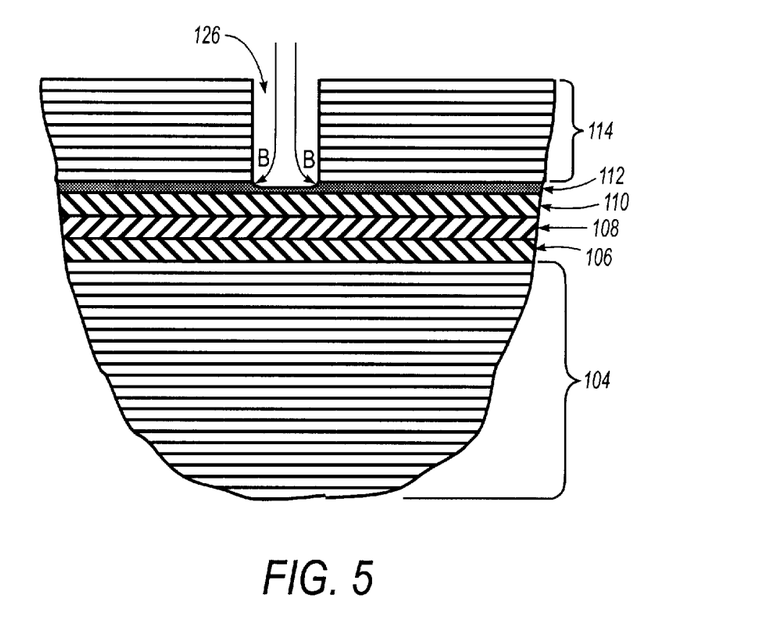
FIG. 5 is a partial side sectional view of the semiconductor structure of FIG. 1 with a channel etched therein.
Figure 6:
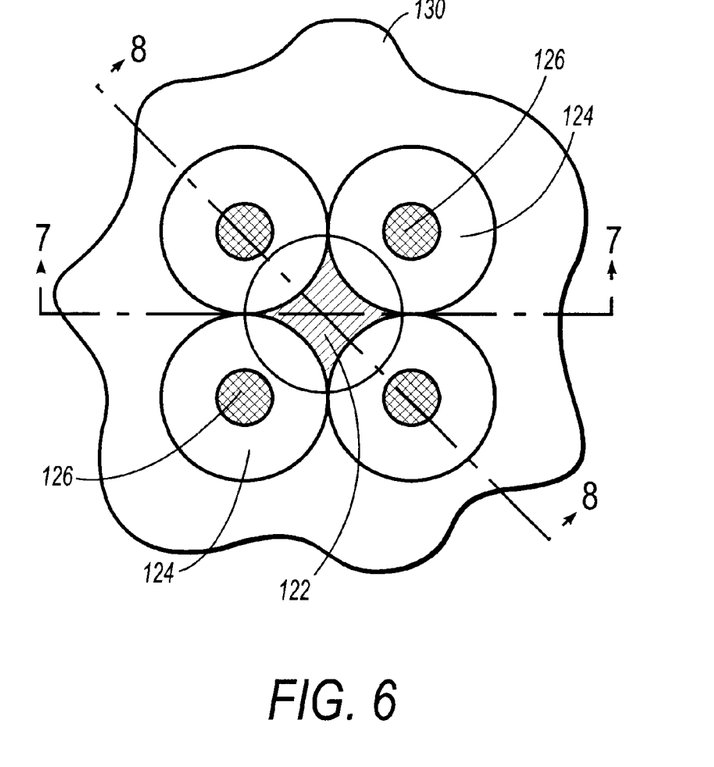
FIG. 6 is a simplified partial plan view of a portion of an oxidation layer, wherein the layers above it have been removed.
Figure 7:
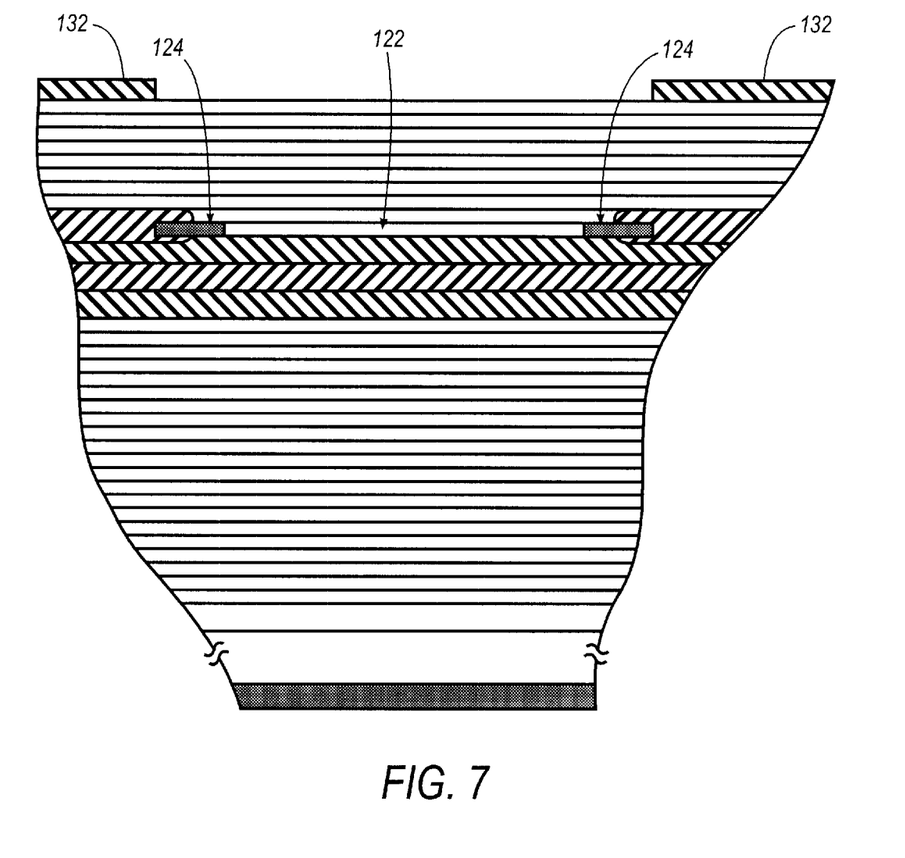
FIG. 7 is an enlarged, partial, cross-sectional view taken substantially along line 7—7 in FIG. 6.
Figure 8:
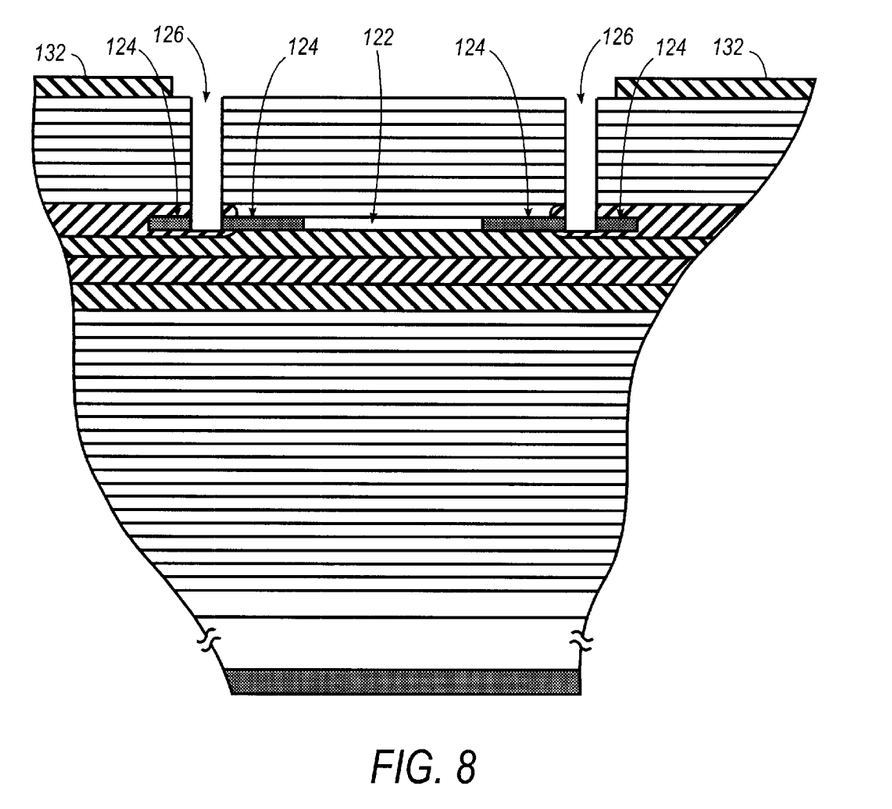
FIG. 8 is an enlarged, partial, cross-sectional view taken substantially along line 8—8 in FIG. 6.

As illustrated in FIG. 5, the sample then undergoes an etching process during which channels 126 are formed in the semiconductor structure through the four exposed areas 120. The etching is performed by a process such as reactive ion etching which provides for the formation of a deep depression with vertical sidewalls. The depth of each cylindrical channel 126 should extend at least into the oxidation layer 112, as shown in FIG. 5. After the formation of the channels 126 and the removal of any photoresist on the surface, the semiconductor sample undergoes an oxidation. The sample is typically oxidized with water vapor in a nitrogen environment at elevated temperatures, in excess of 350° C. During the oxidation process, the oxidation layer 112 is exposed to the ambient environment through each channel 126, as indicated by arrows B. Thus, the oxidation layer 112, which comprises of AlGaAs with a high aluminum content, is oxidized radially outward from each channel 126, typically for an amount of time to allow the oxidized regions 124 surrounding each channel to approach one another and overlap, as can be seen in FIG. 6. However, a small non-oxidized area between the oxidized regions may be permissible so long as electrical and optical fields are adequately confined.

During the oxidation process, other layers in the structure remain essentially unoxidized since their aluminum content is lower. The oxidation rate of AlGaAs increases with the aluminum content in a generally exponential manner at constant temperature. As is well known, the time duration of the oxidation process depends upon the aluminum content in the oxidation layer 112 and the oxidation temperature. A desirable, controllable oxidation duration would be a few tens of minutes. Therefore, the layer that is being oxidized is the AlGaAs which has a high aluminum content of close to 95%. The portion of the AlGaAs layer which remains unoxidized controls the current path through the active layer 108.

FIG. 6 is a largely simplified top view of the oxidation layer 112 shown in FIG. 5, after oxidation, with all the layers above it removed for illustration. The shaded region 122 represents the laser aperture in oxidation layer 112 which determines the region of laser emission by active layer 108. It is formed by the oxidation process of the present invention. During the oxidation process, the oxidation fronts emanate through the oxidation layer from the pattern of channels 126, and the aperture 122 is formed by the intersection of the boundaries of the oxidized regions 124. The oxidation fronts emanating from the channels 126 are also generally similarly shaped, resulting in overlapping oxidized regions 124. The overlapping regions 124 define a central unoxidized region or aperture 122. After the oxidation process, an ion implantation process, which is next described, is used to complete the electrical isolation of the aperture 122.

After the oxidation process, the areas 124 are non-conductive or insulating and the unoxidized portion or aperture 122 is conductive thus controlling the current path through the active layer 108. Current flow through that portion of the active layer 108 which lies below the aperture 122 results in an injected density of p-type and n-type carriers, resulting in optical amplification. At sufficiently high current flow, this optical amplification, in combination with feedback from the DBR mirrors, 104 and 114, will result in laser oscillation and emission from the active layer within the region defined by aperture 122.

In addition to forming non-conductive areas 124 by oxidation, a process is needed to substantially increase the resistivity from a so-called isolation region 130 extending between a perimeter of the device or a top contact of the device inward to an area at least adjacent to areas 124. The highly resistive isolation region 130 prevents currents from shunting through the non-oxidized parts of the oxidation layer 112. In one embodiment, isolation region 130 is formed by using an ion implantation process. As is known in the art, ion implantation depth is dependent on energy levels and/or ions selected. Artisans can perform known calculations or employ commercially available software ("Athena" manufactured by Silvac International, among others) to estimate appropriate energies.

After the isolation process, metal contacts 132 and 134 are formed on the top surface and the bottom surface of the semiconductor structure, respectively, for biasing the laser, as illustrated in FIGS. 7–12. A typical material used for forming the contacts is a titanium/gold bilayer film.

Figure 9:
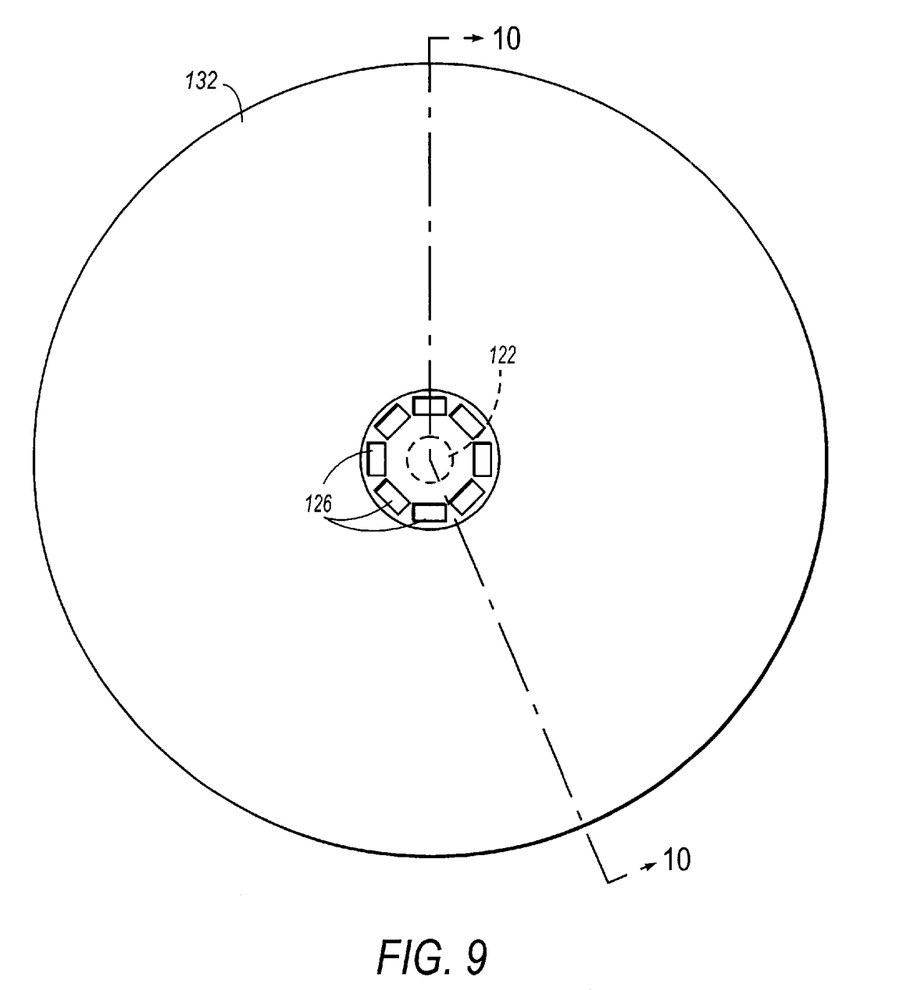
FIG. 9 is a view of a photonic device according to one embodiment of the present invention.

FIG. 9 shows a top view of a semi-conductor structure formed in accordance with the present invention after a typical metallization process to form the top contact 132. The top contact 132 is sized to cover the entire device, thus providing a large surface area and lowered resistance. In the illustrated device, an interruption or annular opening in the contact 132 allows light to be emitted from the device through the interruption. Those skilled in the art will appreciate that if the top contact is transparent, no interruption is required. As discussed above, the convergence of the plurality of oxidized regions 124 form the aperture 122 (shown in ghost).

Figure 10:
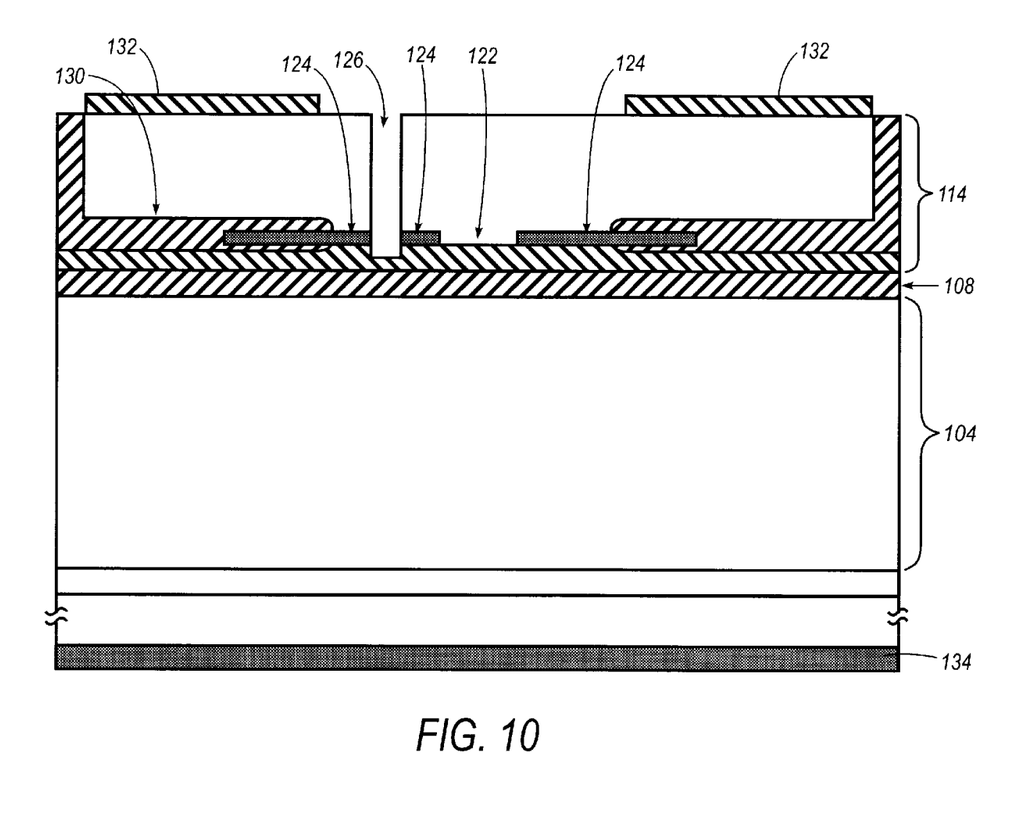
FIG. 10 is a cross-sectional view taken substantially along line 10—10 in FIG. 9.

With reference now to FIG. 10, the cross sectional view taken along lines 10—10 in FIG. 9 is shown. It can now be appreciated that aperture 122, typically on the order of 4 microns in diameter, has a significantly smaller area than the top contact 132. Further, currents generated between the contacts 132, 134 are funneled through the aperture 122 by the presence of the non-conducting regions formed by a combination of the isolation region 130 and the oxidized areas 124.

Figure 11:
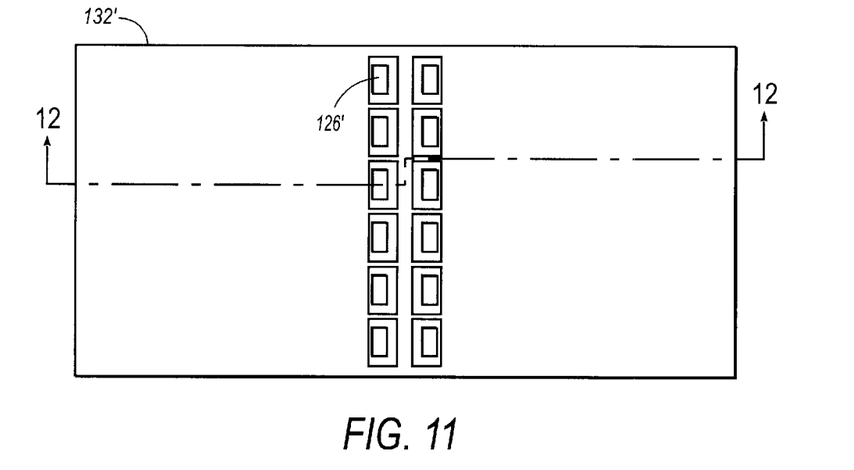
FIG. 11 is a plan view of a photonic device according to another embodiment of the present invention; and, FIG. 12 is a cross-sectional view taken substantially along line 12—12 in FIG. 11.

Referring now to FIG. 11, a top view of an edge-emitting device such as a laser or LED formed in accordance with the present invention is shown. To recognize the similarity between components with similar functions, a convention of reference numeral usage is employed which denotes elements with similar function as the above-described device with a prime (').

The edge-emitting device has stacked epitaxial layers similar to FIG. 3. The layers, which typically are compound semiconductors containing In, Al, Ga, As, P, Sb, and N, function to confine charge carriers, transport charge carriers, emit light, and guide light. However, DBR mirrors 104 and 114 (FIGS. 3, 5) are not typically employed in edge-emitting devices. On the other hand, in one embodiment, the ends of the device are cleaved to form an edge exit for light. In the case of a laser, the cleaved facets form a mirror pair providing the optical feedback necessary to generate laser light.

Figure 12:
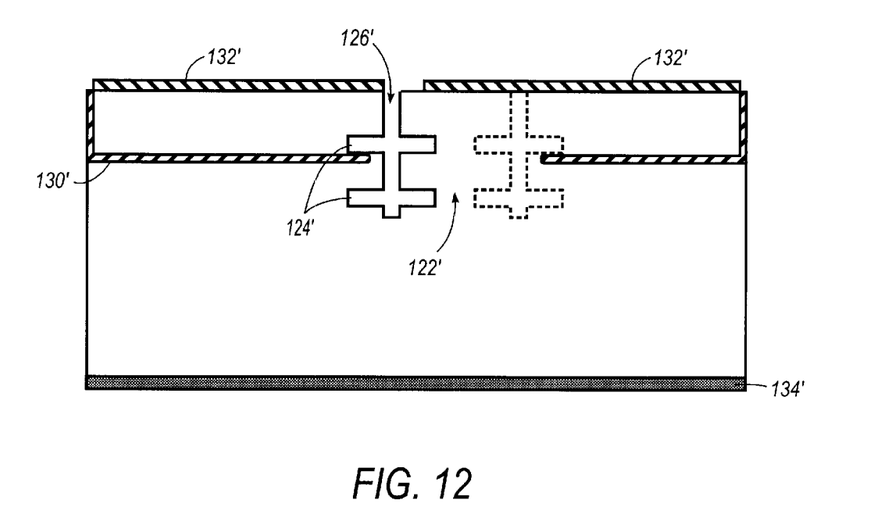

The cross section taken along line 12—12 in FIG. 11 shown in FIG. 12 illustrates a plurality of channels 126' providing access to at least one buried layer that can be selectively oxidized to form a lateral optical waveguide or aperture 122'. As above, the channels 126' and the oxidized areas 124' bound or define the aperture 122'. However, in edge-emitting devices, the boundary, like the direction of emitted light, is best viewed from the side or edge. A short lateral oxidation extent relative to the aperture size ensures accurate control of the final aperture size. In addition to the oxidized areas 124', isolation region 130' contributes to the electrical isolation of the aperture 122'. As known in the art, electrical isolation region 130' can be formed, for example, by ion implantation of Hydrogen.

A typical metallization process has been used to form the top contact 132'. The bottom contact 134' provides a return path for electrical current. Again, the top contact 132' is sized to cover the entire device, thus providing a lowered resistance.

The composition, dopants, doping levels, and dimensions given above are exemplary only, and variations in these parameters are permissible. Additionally, other layers in addition to the ones shown in the figures may also be included. Variations in experimental conditions such as temperature and time are also permitted. Lastly, instead of GaAs and GaAlAs, other semiconductor materials such as GaAlSb, InAlGaP, or other III–V alloys may also be used.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A photonic device comprising:
    a plurality of semiconductor layers, said semiconductor layers comprising an active layer;
    a current controlling region among the semiconductor layers comprising an electrically insulating section and an electrically conductive section, said current controlling region being penetrated by a plurality of channels bounding the electrically conductive section within a perimeter of the channels, said channels extending from a first side of the photonic device to the current controlling region; and
    an electrical contact for selectively applying current through the electrically conductive section, said electrical contact disposed on the first side of the photonic device such that said electrical contact lies entirely outside the perimeter of the channels.

2. The photonic device as set forth in claim 1, wherein the current controlling region comprises an oxidation layer, the electrically insulating section comprises an oxidized portion of the oxidation layer, and the electrically conductive section comprises an unoxidized portion of the oxidation layer.

3. The photonic device as set forth in claim 2, wherein the current controlling region further comprises an electrically insulating ion-implanted layer extending from a perimeter of the device at least to a perimeter of the oxidized portion of the oxidation layer.

4. The photonic device as set forth in claim 1, wherein the active layer comprises a light-generating region disposed between a first reflective region and a second reflective region.

5. The photonic device as set forth in claim 1, wherein the photonic device is selected from the set of vertical cavity surface-emitting lasers, light-emitting diodes, and photo detectors.

6. A photonic device comprising:
    a plurality of semiconductor layers, said semiconductor layers comprising an active layer;
    a current controlling region among the semiconductor layers comprising an electrically insulating section and an electrically conductive section, said current controlling region being penetrated by a plurality of channels bounding the electrically conductive section within a perimeter of the channels, said channels extending from a first side of the photonic device to the current controlling region; and, an electrical contact for selectively applying current through the electrically conductive section, said electrical contact disposed on the first side of the photonic device such that at least part of said electrical contact lies outside the perimeter of the channels, and said electrical contact comprising an area greater than an area within the perimeter of the channels.

7. A photonic device comprising:

a plurality of semiconductor layers, said semiconductor layers comprising an active layer;

a current controlling region among the semiconductor layers comprising an electrically insulating section and an electrically conductive section, said current controlling region being penetrated by a plurality of channels bounding the electrically conductive section within a perimeter of the channels, said channels extending from a first side of the photonic device to the current controlling region; and an electrical contact for selectively applying current through the electrically conductive section, said electrical contact disposed on the first side of the photonic device such that at least part of said electrical contact lies outside the perimeter of the channels, said electrical contact comprising an area at least 2 times greater than an area of the electrically conductive section.

8. A photonic semiconductor device comprising:

a plurality of spaced channels formed in a semiconductor layer, said channels bounding a desired aperture; and an electrical contact affixed to the semiconductor layer, said electrical contact having an area at least 2 times greater than an area of the desired aperture.

9. The photonic semiconductor device as set forth in claim 8, further comprising:

in communication with the plurality of spaced channels, a current controlling region comprising a generally conductive section and a generally non-conductive section.

10. The photonic semiconductor device as set forth in claim 9, wherein the current controlling region comprises a buried oxide layer selectively alterable between electrically insulating and electrically conducting.

11. The photonic semiconductor device as set forth in claim 10, wherein the nonconductive section comprises:

an oxidized layer surrounding each of the plurality of spaced channels; and, a layer adjoining the oxidized layer, implanted with ions at a selected energy.

12. The photonic semiconductor device as set forth in claim 8, wherein the electrical contact is disposed on the device such that at least part of said electrical contact lies outside of the plurality of spaced channels.

13. A method of forming a photonic device comprising:

forming a plurality of spaced channels in a surface of a semiconductor layer bounding a desired aperture; and affixing an electrical contact to the semiconductor layer, said electrical contact extending beyond an area bounded by the plurality of spaced channels.

14. The method of forming a photonic device as set forth in claim 13, wherein the channels permit communication between the surface of the semiconductor layer and a buried oxide layer, the method further comprising:

via the channels, oxidizing a selected portion of the oxide layer.

15. The method of forming a photonic device as set forth in claim 14, further comprising:

implanting a region adjoining the oxidized portion of the oxide layer with ions at a selected energy.

* * * * *